(12) United States Patent
Delgado Acarreta et al.

(10) Patent No.: US 10,197,349 B2
(45) Date of Patent: Feb. 5, 2019

(54) CARTRIDGE-IN-CHAMBER DETECTION SYSTEM FOR WEAPONS

(71) Applicant: RADE TECNOLOGIAS, S.L., Saragossa (ES)

(72) Inventors: Raul Delgado Acarreta, Saragossa (ES); Daniel Osuna Sanz, Saragossa (ES); Javier Granado Fornas, Saragossa (ES)

(73) Assignee: RADE TECNOLOGIAS, S.L., Saragossa (ES)

( * ) Notice: Subject to any disclaimer, the term of this patent is extended or adjusted under 35 U.S.C. 154(b) by 0 days.

(21) Appl. No.: 15/872,357

(22) Filed: Jan. 16, 2018

(65) Prior Publication Data

US 2018/0238648 A1 Aug. 23, 2018

(30) Foreign Application Priority Data

Jan. 16, 2017 (ES) .................................. 201730038

(51) Int. Cl.
*F41A 9/53* (2006.01)
*G01R 27/26* (2006.01)

(52) U.S. Cl.
CPC ............ *F41A 9/53* (2013.01); *G01R 27/2605* (2013.01)

(58) Field of Classification Search
USPC ....................................................... 42/1.05
See application file for complete search history.

(56) References Cited

U.S. PATENT DOCUMENTS

| 5,755,056 A | 5/1998 | Danner et al. |
| 5,799,433 A * | 9/1998 | Danner ..................... F41A 3/22 42/1.05 |
| 2004/0107620 A1* | 6/2004 | Haefeli ................... F41A 17/06 42/1.05 |
| 2008/0039962 A1 | 2/2008 | McRae |
| 2010/0139141 A1 | 6/2010 | Pikielny |

FOREIGN PATENT DOCUMENTS

| EP | 0276843 A2 | 8/1988 |
| ES | 2613099 | 5/2017 |
| WO | 2016113437 A1 | 7/2016 |
| WO | 2016113455 A1 | 7/2016 |

* cited by examiner

*Primary Examiner* — J. Woodrow Eldred
(74) *Attorney, Agent, or Firm* — Hayes Soloway, PC

(57) ABSTRACT

The present invention relates to a cartridge-in-chamber detection system for weapons wherein the state of the cartridge in the chamber is independent in order to provide a reliable indication of the presence or absence of the cartridge in the chamber of the weapon, wherein the system comprises means to, through a supply voltage, determine the variation of the electrical capacity between the two possible states of the system, when there is no cartridge in the chamber and when there is a cartridge in the chamber, making use of at least one electrode, without the cartridge intervening in the system.

19 Claims, 3 Drawing Sheets

CARTRIDGE-IN-CHAMBER DETECTION SYSTEM FOR WEAPONS

CROSS-REFERENCE TO RELATED APPLICATIONS

This patent application claims the benefit of and priority to ES Patent Application No. P201730038, filed on Jan. 16, 2017. The disclosure of this patent application is herein incorporated by reference in its entirety.

DESCRIPTION

Object of the Invention

The present invention relates to a cartridge-in-chamber detection system for weapons wherein the state of the cartridge in the chamber is independent in order to provide a reliable indication of the presence or absence of the cartridge in said chamber of the weapon.

The object of the present invention is a cartridge-in-chamber detection system for weapons that comprises means to, through a supply voltage, determine the variation of the electrical capacity between the two possible states of the system, the two states being when there is no cartridge in the chamber and when there is a cartridge in the chamber, making use of at least one electrode, without the cartridge intervening in the system.

BACKGROUND OF THE INVENTION

Systems that enable electric weapons to be controlled by detecting the presence of a cartridge in a chamber, wherein said systems provide means to, through a supply voltage, determine the impedance of the cartridge in two possible states of the system, when there is no cartridge in the chamber and when there is a cartridge in the chamber, making use of two electrodes, are known in the state of the art.

Among the previous systems is the one described in U.S. Pat. No. 5,755,056A, relating to an electronic weapon and process for controlling said weapon, wherein electrodes are positioned to electrically contact with conductive portions of a round of ammunition within the chamber, voltage supply means for at least one of the electrodes, means for measuring the resistance between the electrodes and means for comparing the measured resistance to at least one reference.

The system described in the aforementioned patent comprises a comparator circuit to detect the presence of a cartridge, and specifically to detect ammunition that can be electrically fired. The circuit is formed by the contacts between the electrodes and a cartridge. If the cartridge is between the two electrodes, the current will be transmitted from one of the electrodes, which can be a firing pin, through the cartridge, to the second electrode, which can be the barrel of the weapon.

However, the measurement of the impedance may be affected by the presence of the user, since the measurement may be distorted depending on whether or not the user makes contact with the metallic parts of the weapon.

The international application WO2016113455A1, by the same applicant of the present application, which describes a cartridge-in-chamber detection system for weapons wherein a microprocessor, by means of a sensor circuit, detects the capacitive variation between the situation in which at least one electrical contact is electrically connected to at least the metallic parts of the weapon and the cartridge, and the situation in which the at least one electrical contact is not electrically connected to at least the metallic parts of the weapon and the cartridge, thereby allowing the presence or absence, respectively, of the cartridge in the chamber to be determined, is also known.

In the aforementioned system, the electrical contact associated with the capacity variation is in electrical contact with the cartridge and the metallic parts of the weapon in contact with the cartridge when said cartridge is in the chamber, which makes it so that in situations in which the cartridge is defective, for example when the metallic rim of the same has been dented during the handling thereof, the absence cartridge in the chamber is erroneously determined, when in fact the cartridge is in the same.

The cartridge-in-chamber detection system for weapons of the present invention has a configuration that solves all of the aforementioned drawbacks, providing a system that does not depend on the presence of defects in the cartridge of the weapon.

DESCRIPTION OF THE INVENTION

The present invention relates to a cartridge-in-chamber detection system for weapons wherein the state of the cartridge in the chamber is independent in order to provide a reliable indication of the presence or absence of the cartridge in said chamber of the weapon.

The cartridge-in-chamber detection system for weapons comprises at least one electrical contact that is connected to a microprocessor by means of a sensor circuit, wherein:

a) the at least one electrical contact is in electrical contact with a moveable conductive element when a cartridge is not in the chamber, with both elements remaining, the moveable conductive element and the at least one electrical contact, and as a result, the metallic parts of the weapon that are in physical contact with the moveable conductive element, electrically connected, and wherein the microprocessor, by means of the sensor circuit, detects the capacitive variation between the situation in which the at least one electrical contact is electrically connected to at least the metallic parts of the weapon and the moveable conductive element, and the situation in which the at least one electrical contact is not electrically connected to at least the metallic parts of the weapon and the moveable conductive element, thereby allowing the absence or presence, respectively, of the cartridge in the chamber to be determined, or b) the at least one electrical contact is not in electrical contact with a moveable conductive element when a cartridge is not in the chamber, with both elements remaining, the moveable conductive element and the at least one electrical contact, and as a result, the metallic parts of the weapon that are in physical contact with the moveable conductive element, electrically disconnected, and wherein the microprocessor, by means of the sensor circuit, detects the capacitive variation between the situation in which the at least one electrical contact is electrically connected to at least the metallic parts of the weapon and the moveable conductive element, and the situation in which the at least one electrical contact is not electrically connected to at least the metallic parts of the weapon and the moveable conductive element, thereby allowing the presence or absence, respectively, of the cartridge in the chamber to be determined.

Optionally, the cartridge-in-chamber detection system for weapons comprises a sleeve arranged over the moveable conductive element, a sleeve wherein the at least one electrical contact is arranged.

Preferably, the moveable conductive element is arranged inside a bolt.

Also preferably, the moveable conductive element is at least partially arranged in the chamber when the cartridge is not in the chamber.

Preferably, the moveable conductive element is moveable from the position in which the cartridge is in the chamber to the position in which the cartridge is not in the chamber, or vice versa.

Preferably, the capacitive variation between the situation in which the at least one electrical contact is electrically connected to at least the metallic parts of the weapon and the moveable conductive element, and the situation in which the at least one electrical contact is not electrically connected to at least the metallic parts of the weapon and the moveable conductive element, is positive, in other words, the capacity is greater in the situation in which the at least one electrical contact is electrically connected to at least the metallic parts of the weapon and the moveable conductive element than in the situation in which the at least one electrical contact is not electrically connected to at least the metallic parts of the weapon and the moveable conductive element.

Preferably, the moveable conductive element is a weapon's own element.

Preferably, the moveable conductive element is a weapon's own modified element.

Preferably, the moveable conductive element is an element external to the weapon.

This way, according to the cartridge-in-chamber detection system for weapons of the present invention, the measurement of the capacity is independent from the state of the cartridge, which could lead to erroneous situations in cases where the cartridge is defective, associating the capacitive variation with an internal element of the weapon.

PREFERRED EMBODIMENT OF THE INVENTION

Figure 1:
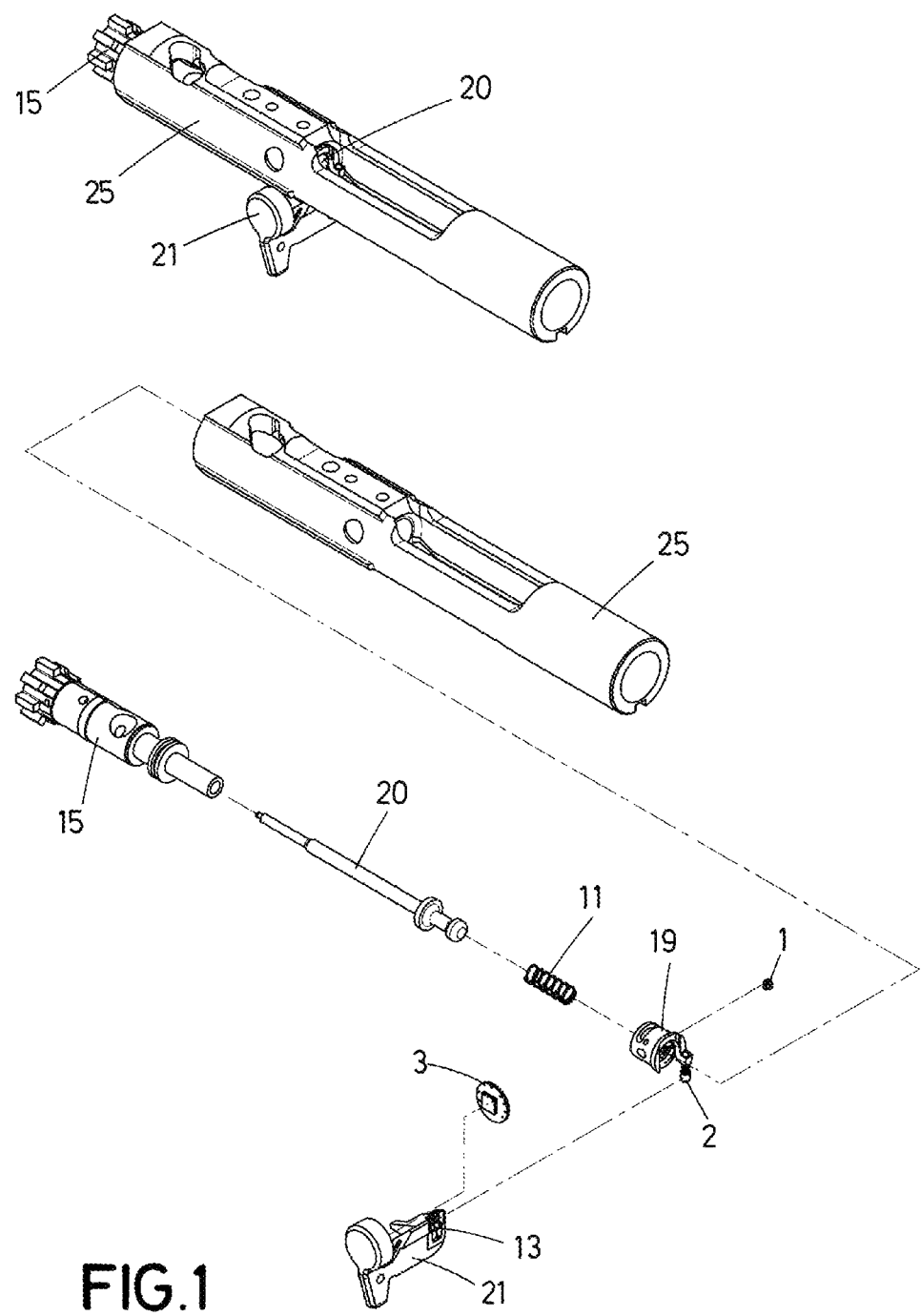
FIG. 1 shows an exploded perspective view of the cartridge-in-chamber detection system for weapons according to an exemplary embodiment of the present invention.
Figure 2:
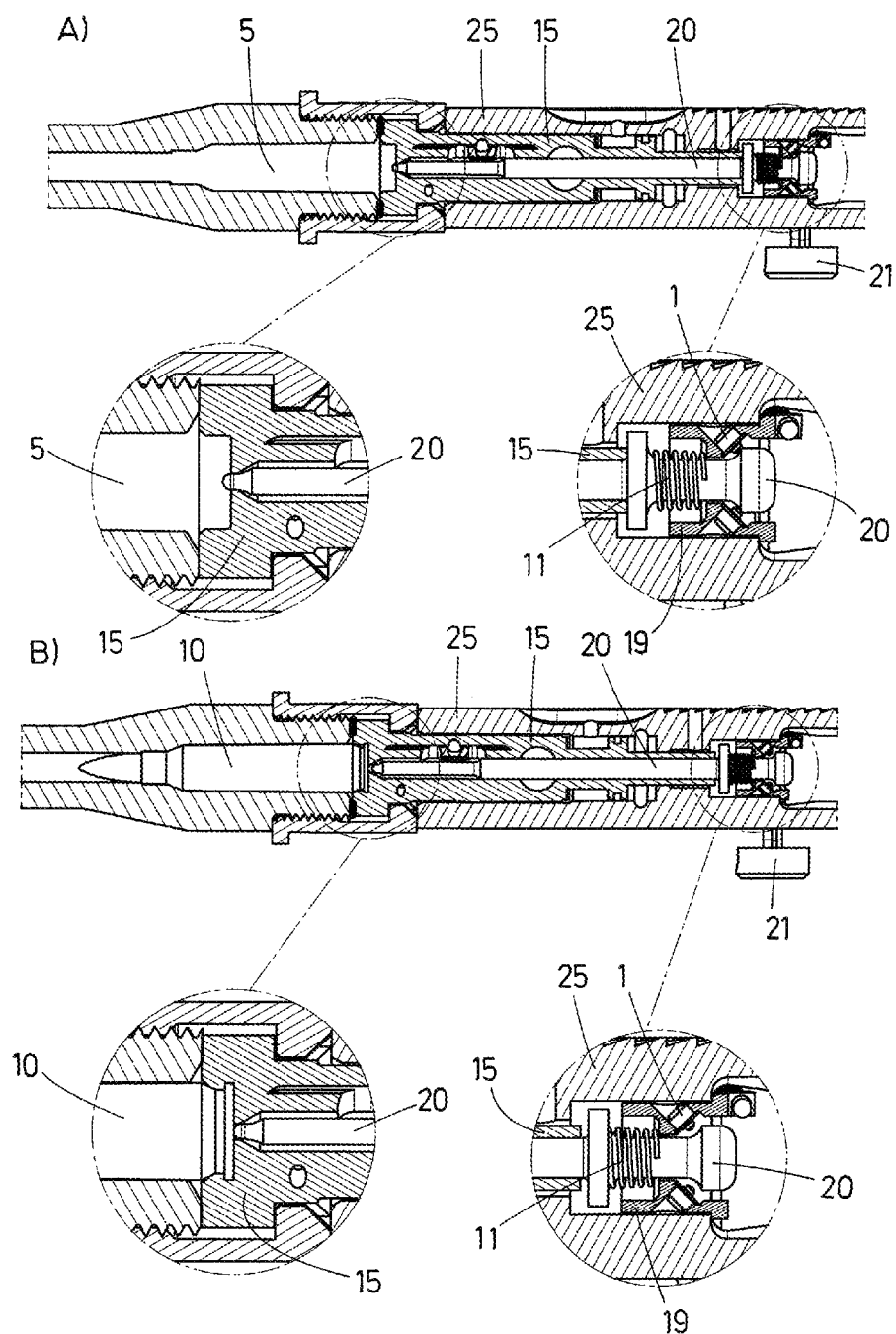
FIG. 2 shows a cross-sectional view of a series of drawings of FIG. 1, adding the barrel of the weapon and a joining piece between the barrel and the bolt carrier, where in FIG. 2A) it is shown in the situation in which there is no cartridge in the chamber, and in FIG. 2B), the situation in which there is a cartridge in the chamber is shown.
Figure 3:
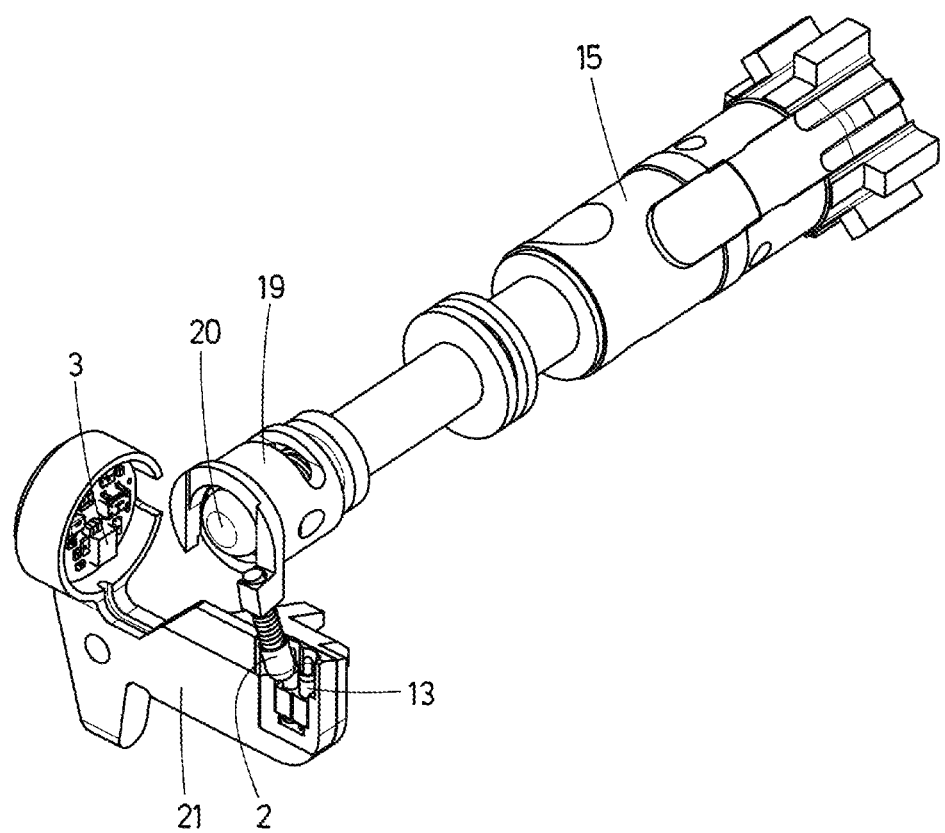
FIG. 3 shows a perspective view of the sleeve, the bolt and the bolt catch together with the second and third electrical contact.

Below is a more detailed description of a preferred embodiment of the cartridge-in-chamber detection system for weapons of the present invention.

The cartridge-in-chamber detection system for weapons comprises at least one electrical contact (1) which is in electrical connected by means of a sensor circuit to a microprocessor (3), characterized in that the at least one electrical contact (1) is in electrical contact with a moveable conductive element, which in this preferred embodiment is a firing pin (20), when a cartridge (10) is not in the chamber (5), with both elements remaining, the moveable conductive element and the at least one electrical contact (1), and as a result, the metallic parts of the weapon, such as a bolt (15) and a bolt carrier (25), that are in physical contact with the moveable conductive element, electrically connected, and wherein the microprocessor (3), by means of a sensor circuit, detects the capacitive variation between the situation in which the at least one electrical contact (1) is electrically connected to at least the metallic parts of the weapon (15, 25) and the moveable conductive element, and the situation in which the at least one electrical contact (1) is not electrically connected to at least the metallic parts of the weapon (15, 25) and the moveable conductive element, thereby allowing the absence or presence, respectively, of the cartridge (10) in the chamber (5) to be determined.

In this exemplary embodiment, the cartridge-in-chamber detection system for weapons comprises a sleeve (19) arranged over the firing pin (20), a sleeve (19) wherein the at least one electrical contact (1) is arranged.

In this exemplary embodiment, the cartridge-in-chamber detection system for weapons comprises a first electrical contact (1) arranged in the sleeve (19) that is in electrical contact with the firing pin (20) when the cartridge (10) is not in the chamber (5), and a second electrical contact (2) arranged in the sleeve (19), wherein the second electrical contact (2) makes contact with a third electrical contact (13) arranged on a bolt catch (21), independent of the absence or presence of the cartridge (10) in the chamber (5), wherein the third electrical contact (13) is connected to the microprocessor (3) by means of the sensor circuit.

In the situation in which the first electrical contact (1) is not electrically connected to at least the metallic parts of the weapon (15, 25) and the firing pin (20), to determine the presence of the cartridge (10) in the chamber (5), the firing pin (20) does not physical contact with the second (2) and third (13) electrical contact.

The cartridge-in-chamber detection system for weapons comprises an elastic element (11) arranged between the sleeve (19) and the firing pin (20) that secures the firing pin (20) when the cartridge (10) is not in the chamber (5).

In this exemplary embodiment, the firing pin (20) is arranged inside the bolt (15), the firing pin (20) at least partially arranged in the chamber (5) when the cartridge (10) is not in the chamber (5), wherein the firing pin (20), bolt (15), sleeve (19) and the first (1) and second (2) electrical contacts are arranged in the bolt carrier (25).

In this exemplary embodiment, the bolt catch (21) is electrically isolated with the exception of the third electrical contact (13) arranged in the same (21).

Preferably, the capacitive variation between the situation in which the first (1), second (2) and third (13) electrical contacts are electrically connected to at least the metallic parts of the weapon (15, 25) and the firing pin (20), and the situation in which the first (1), second (2) and third (13) electrical contact are not electrically connected to at least the metallic parts of the weapon (15, 25) and the firing pin (20) is positive, in other words, the capacity is greater in the situation in which the first (1), second (2) and third (13) electrical contacts are electrically connected to at least the metallic parts of the weapon (15, 25) and the firing pin (20) than in the situation in which the first (1), second (2) and third (13) electrical contact are not electrically connected to at least the metallic parts of the weapon (15, 25) and the firing pin (20).

The firing pin (20) is moveable, preferably 1 mm, from the position in which the cartridge (10) is in the chamber (5) to the position in which the cartridge (10) is not in the chamber (5), or vice versa.

The invention claimed is:

1. A cartridge-in-chamber detection system for weapons, the system comprising:
    at least one electrical contact connected to a microprocessor by a sensor circuit,
    a movable conductive element movable between a connected position and a disconnected position, wherein the at least one electrical contact is in electrical contact with the moveable conductive element when the movable conductive element is in the connected position and not in electrical contact when the movable conductive element is in the disconnected position,
    at least one metallic part of the weapon is in physical contact with the moveable conductive element, and
    wherein the microprocessor, through the sensor circuit, detects a capacitive variation between the positions of the moveable conductive element, thereby allowing the absence or presence of the cartridge in the chamber to be determined.

2. The system of claim 1, further comprising a sleeve arranged over the moveable conductive element, sleeve wherein the at least one electrical contact is arranged.

3. The system of claim 1, wherein the moveable conductive element is arranged inside a bolt.

4. The system of claim 1, wherein the moveable conductive element is at least partially arranged in the chamber when the cartridge is not in the chamber.

5. The system of claim 1, wherein the moveable conductive element is moveable from the position in which the cartridge is in the chamber to the position in which the cartridge is not in the chamber, or vice versa.

6. The system of claim 1, wherein the capacitive variation between the positions of the conductive moveable element, is positive.

7. The system of claim 1, wherein the moveable conductive element is a weapon's own element.

8. The system of claim 1, wherein the moveable conductive element is a weapon's own modified element.

9. The system of claim 1, wherein the moveable conductive element is an element external to the weapon.

10. The system of claim 1, wherein the moveable conductive element is a firing pin.

11. The system of claim 4, wherein the moveable conductive element is a firing pin.

12. The system of claim 11, further comprising a first electrical contact arranged in the sleeve that is in electrical contact with the firing pin when the cartridge is not in the chamber, and a second electrical contact arranged in the sleeve, wherein the second electrical contact makes contact with a third electrical contact arranged on a bolt catch regardless of the absence or presence of the cartridge in the chamber, wherein the third electrical contact is connected to the microprocessor by the sensor circuit.

13. The system of claim 12, wherein in the disconnected position, the firing pin does not make physical contact with the second and third electrical contact.

14. The system of claim 12, further comprising an elastic element arranged between the sleeve and the firing pin that secures the firing pin when the cartridge is not in the chamber.

15. The system of claim 12, wherein the bolt catch is electrically isolated with the exception of the third electrical contact arranged on the same.

16. The system of claim 10, wherein the firing pin is moveable 1 mm from the position in which the cartridge is in the chamber to the position in which the cartridge is not in the chamber, or vice versa.

17. The system of claim 11, wherein the firing pin is moveable 1 mm from the position in which the cartridge is in the chamber to the position in which the cartridge is not in the chamber, or vice versa.

18. The system of claim 2, wherein the moveable conductive element is arranged inside a bolt.

19. The system of claim 2, wherein the moveable conductive element is at least partially arranged in the chamber when the cartridge is not in the chamber.

\* \* \* \* \*